US009048929B2

(12) United States Patent  (10) Patent No.: US 9,048,929 B2
Preschutti  (45) Date of Patent: Jun. 2, 2015

(54) BROADBAND RADIO FREQUENCY DATA COMMUNICATION SYSTEM USING TWISTED PAIR WIRING

(71) Applicant: Tyco Electronics Corporation, Berwyn, PA (US)

(72) Inventor: Joseph P. Preschutti, Boalsburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 157 days.

(21) Appl. No.: 13/648,646

(22) Filed: Oct. 10, 2012

(65) Prior Publication Data

US 2013/0088987 A1  Apr. 11, 2013

Related U.S. Application Data

(60) Provisional application No. 61/545,476, filed on Oct. 10, 2011.

(51) Int. Cl.
| *H04B 3/46* | (2006.01) |
| *H04L 12/911* | (2013.01) |
| *H04B 3/48* | (2006.01) |
| *H04B 3/32* | (2006.01) |
| *H04L 12/28* | (2006.01) |
| *H03G 3/30* | (2006.01) |

(52) U.S. Cl.
CPC *H04B 3/46* (2013.01); *H04L 47/70* (2013.01); *H04B 3/48* (2013.01); *H04B 3/32* (2013.01); *H04L 12/2801* (2013.01); *H04L 12/2869* (2013.01); *H03G 3/3036* (2013.01); *H03G 3/3042* (2013.01)

(58) Field of Classification Search
USPC .................... 370/276, 282, 288, 463
See application file for complete search history.

(56) References Cited

U.S. PATENT DOCUMENTS

| 4,763,326 | A | * | 8/1988 | Krick ............................. 370/527 |
| 6,346,964 | B1 | | 2/2002 | Rogers et al. |
| 2005/0044573 | A1 | * | 2/2005 | Preschutti ....................... 725/78 |
| 2005/0083856 | A1 | * | 4/2005 | Morelli et al. ................ 370/254 |
| 2006/0117364 | A1 | | 6/2006 | Vitenberg |
| 2010/0100918 | A1 | | 4/2010 | Egan, Jr. et al. |
| 2010/0100922 | A1 | | 4/2010 | Olson et al. |
| 2010/0278050 | A1 | * | 11/2010 | Afzal et al. ................... 370/242 |
| 2010/0329247 | A1 | | 12/2010 | Kennedy et al. |
| 2012/0242495 | A1 | * | 9/2012 | Aguirre et al. ........... 340/815.45 |

OTHER PUBLICATIONS

International Search Report and Written Opinion for PCT/US2012/059539 mailed Apr. 22, 2013.

* cited by examiner

*Primary Examiner* — Kerri Rose
(74) *Attorney, Agent, or Firm* — Merchant & Gould P.C.

(57) ABSTRACT

A system for distributing broadband signals via twisted pair wiring is disclosed. Various aspects of the system involve use of a broadband signal distribution interface device and/or a broadband line driver. In one aspect, a broadband signal distribution interface device includes a broadband signal interface configured to receive broadband radio frequency signals, and a plurality of broadband signal connections configured to distribute broadband radio frequency signals. The interface device also includes circuitry defining an upstream signal path and a downstream signal path and including a gain control circuit and a slope control circuit each positioned along the downstream signal path. The circuitry is configured to accommodate downstream transmission of the broadband signals onto twisted pair wiring.

26 Claims, 7 Drawing Sheets

BROADBAND RADIO FREQUENCY DATA COMMUNICATION SYSTEM USING TWISTED PAIR WIRING

CROSS-REFERENCE TO RELATED APPLICATION

The present application claims the benefit of U.S. Provisional Patent Application Ser. No. 61/545,476, filed Oct. 10, 2011, which application is hereby incorporated by reference in its entirety.

TECHNICAL FIELD

The present disclosure relates generally to distribution of broadband signals, such as cable television signals. In particular, the present disclosure relates to a broadband radio frequency data communication system using twisted pair wiring.

BACKGROUND

Broadband radio frequency systems, such as cable television systems, typically use coaxial cables to distribute signals from a head end to a facility, and also for wiring within any facility. At the facility, devices configured to receive broadband signals, such as televisions, set-top boxes, computing systems, or other devices, are preconfigured to receive signals having power levels within a particular range. For example, analog signals received at a subscriber device are generally required to be in the range of 0 to +20 dBmV, while digital signals are generally distributed in the range of −10 dBmV to +20 dBmV.

When broadband signals are received at a facility, they are traditionally routed to wall outlets or other subscriber locations using coaxial cabling. This presents challenges to the technician/installer. This is because there are few standards for routing of coaxial cable networks—the lack of standards leads to many different wiring configurations within a facility, leading to nonstandard and unreliable cabling and loss levels at different locations within a facility. In some cases, to address the lack of standards available in RF cabling, systems have been developed which take advantage of twisted pair wiring at a facility to deliver radio frequency signals. Use of twisted pair wiring allows installation technicians to utilize familiar design standards to distribute signals throughout the facility.

Delivering RF signals via twisted pair wiring is not without drawbacks. For example, although layout standards are more standardized for twisted pair wiring than coaxial wiring, twisted pair wiring experiences comparatively greater levels of loss. For example, on a 90 meter length of Category 6A Unshielded Twisted Pair cable, attenuation at 862 MHz is approximately 54 dB, while a coaxial cable of equivalent length has approximately 18 dB attenuation. Additionally, the difference in attenuation between the highest and lowest frequencies is substantially greater in twisted pair media. The 90 meter twisted pair cable described above would have approximately 17 dB of loss at 85 MHz while an equal length of RG-6 coaxial cable has approximately 6 dB of loss. So the loss difference between 862 MHz and 85 MHz is approximately 37 dB in twisted pair media, while it is closer to 12 dB in coaxial media.

Accordingly, greater attenuation and greater difference in attenuation between the highest and lowest frequencies result in twisted-pair wiring systems having different operational requirements as compared to coaxial systems. This is especially the case for devices designed to deliver broadband services (e.g., cable television) over a TIA-568 Compliant Twisted Pair infrastructure. In such cases, the increased signal attenuation occurring due to transmission of broadband services over twisted pair wiring can result in data degradation or loss if the overall systems are not adjusted to accommodate for such attenuation losses.

SUMMARY

In accordance with the following disclosure, the above and other issues are addressed by the following:

In a first aspect, a broadband signal distribution interface device includes a broadband signal interface configured to receive broadband radio frequency signals, and a plurality of broadband signal connections configured to distribute broadband radio frequency signals. The broadband signal distribution interface device also includes circuitry defining an upstream signal path and a downstream signal path between the broadband signal interface and the plurality of broadband signal connections, the upstream signal path defining a low frequency range and the downstream signal path defining a high frequency range. The circuitry includes a gain control circuit and a slope control circuit each positioned along the downstream signal path, wherein the circuitry is configured to accommodate downstream transmission of the broadband signals onto twisted pair wiring.

In a second aspect, a broadband line driver includes a broadband signal interface configured to send and receive broadband radio frequency signals, and a plurality of twisted pair connections, each of the twisted pair connections configured to distribute broadband radio frequency signals. The broadband line driver includes circuitry defining an upstream signal path and a downstream signal path communicatively connected to the broadband signal input interface, the upstream signal path defining a low frequency range and the downstream signal path defining a high frequency range. The broadband line driver also includes a twisted pair interface circuit having an outbound signal path connecting one of the plurality of twisted pair connections to the downstream signal path and an inbound signal path connecting the one of the plurality of twisted pair connections to the upstream signal path. The twisted pair interface circuit includes an amplifier positioned on the outbound signal path, a radio frequency switch positioned on the inbound signal path, and a voltage monitoring circuit configured to activate one or both of the amplifier and the radio frequency switch depending upon an observed voltage.

In a third aspect, a method of adjusting output power of broadband radio frequency signals on twisted pair lines includes monitoring a reference voltage level received at a broadband line driver via a twisted pair connection. The method includes, upon determining that the reference voltage level exceeds a predetermined level, deactivating an amplifier connected to a downstream path leading to the twisted pair connection and setting a radio frequency switch connected along an upstream path to a high attenuation condition. The method also includes, upon determining that the reference voltage is below a second predetermined level, activating the amplifier and setting the radio frequency switch to a high attenuation condition The method further includes, upon determining that the reference voltage exceeds a third predetermined level, activating the amplifier and setting the radio frequency switch to a low attenuation condition.

In a fourth aspect, a broadband signal distribution system useable at a facility, that includes a broadband signal distribution interface device and a plurality of broadband line drivers. The broadband signal distribution interface device is configured to receive broadband radio frequency signals from a headend and including a plurality of broadband signal connections, and includes circuitry defining an upstream signal path and a downstream signal path, the circuitry including a gain control circuit and a slope control circuit each positioned along the downstream signal path, wherein the circuitry is configured to accommodate downstream transmission of the broadband signals onto twisted pair wiring. The broadband line drivers are communicatively coupled to the broadband signal connections of the broadband signal distribution interface device, and each include a plurality of twisted pair interfaces. Each twisted pair interface associated with a twisted pair interface circuit has an outbound signal path and an inbound signal path, the twisted pair interface circuit including an amplifier positioned on the outbound signal path and a radio frequency switch positioned on the inbound signal path, and a voltage monitoring circuit configured to activate one or both of the amplifier and the radio frequency switch depending upon an observed voltage or a signal received from an active balun device configured to receive broadband signals over twisted pair wiring for connection to a broadband endpoint.

DETAILED DESCRIPTION

Figure 1:
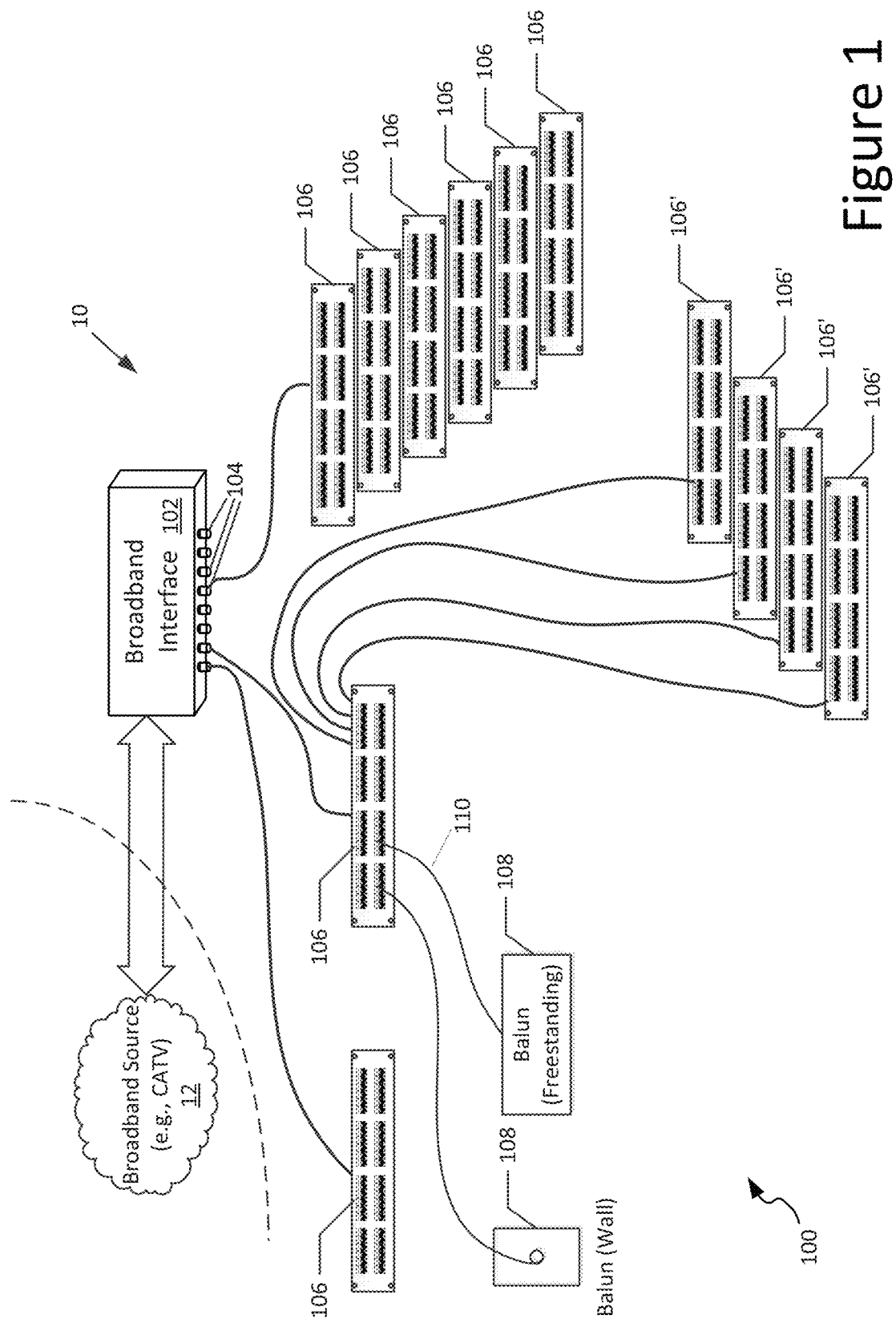
FIG. 1 illustrates an example twisted pair broadband radio frequency distribution system useable at a facility, in which radio frequency signals are passed over twisted pair wiring.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general, the present disclosure relates to an improved system for delivering broadband radio frequency signals to endpoints at a facility using twisted pair wiring at the facility.

The systems, devices, and methods discussed herein provide for selective, connection-by-connection signal amplification, which results in power consumption on an as-needed basis. Additionally, in certain aspects, the present disclosure provides a system that can be used concurrently with existing data communication networks, over shared twisted pair wiring. Other advantages exist as well.

Referring now to FIG. 1, an example twisted pair broadband radio frequency distribution system 100 is shown. The system 100 is useable at a facility 10, which can be any building or set of buildings positioned in relative proximity to one another such that local cabling can be shared among the buildings, for example according to TIA-568 Twisted Pair Wiring standards. The system 100 receives broadband radio frequency signals from an upstream source 12, such as a headend or other broadband radio frequency signal distribution source.

In the embodiment shown, the system 100 includes a broadband signal distribution interface device 102 which receives broadband radio frequency signals from the upstream source 12. In various embodiments, the broadband distribution interface device 102 can receive these signals via an optical network, a coaxial cable network, or other types of differential signaling networks. The broadband distribution interface device 102 includes a plurality of distribution connections 104, useable to distribute broadband radio frequency signals to downstream devices. In various embodiments, the distribution connections 104 can be optical or coaxial cable connections, and may be the same type of connection as that used by the broadband distribution interface device 102 to receive signals from the upstream source 12.

In certain embodiments the broadband signal distribution interface device 102 can include a number of features relating to adjustment of gain and slope of signals received at the facility, to ensure that the signals are adequately conditioned for transmission on both traditional coaxial as well as twisted pair wiring. Although in various embodiments a variety of types of signal conditioning circuitry and routing circuitry can be included in the broadband distribution interface device 102, an example implementation of such circuitry is discussed below in connection with FIG. 3.

As illustrated in FIG. 1, the system 100 also includes a plurality of broadband line drivers 106. The broadband line drivers 106 generally include a broadband signal interface configured to send and receive broadband radio frequency signals, for example using a coaxial or optical cable connection. The broadband line drivers 106 each also include twisted pair connections configured to distribute broadband radio frequency signals via a twisted pair connection, for example on an unassigned pair of a 10/100BaseT connection (e.g., the 7-8 pair of a four-pair twisted pair wire).

Figure 4:
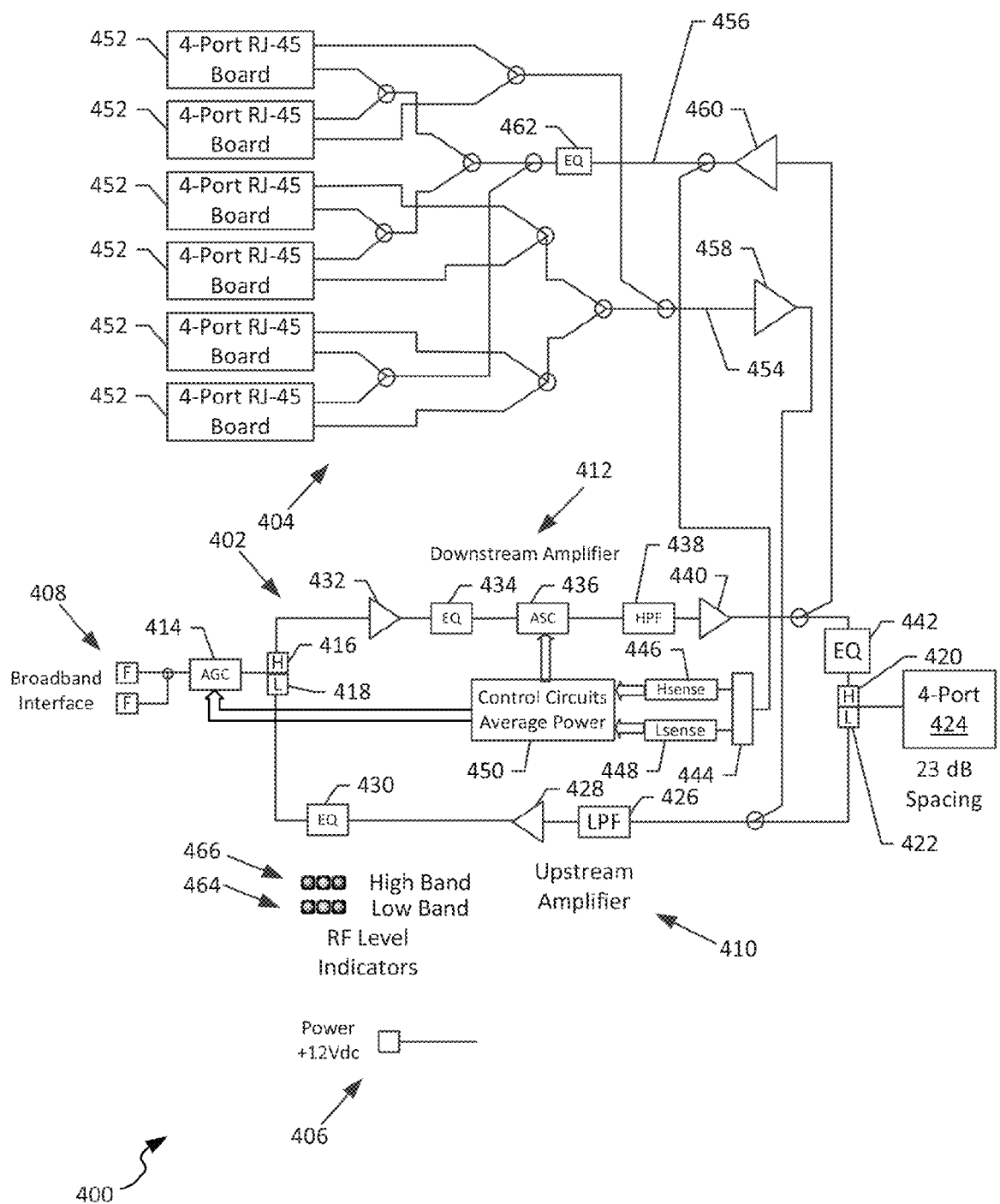
FIG. 4 is a schematic diagram illustrating signal routing and adjustment for broadband signal repeat and amplification within a line driver used in the twisted pair broadband radio frequency distribution system of FIG. 1.

The broadband line drivers 106 also optionally include a plurality of broadband radio frequency signal distribution connections, as illustrated in further detail in FIG. 4. As shown, the broadband radio frequency signal distribution connections allow for connection of a first broadband line driver 106 to a second broadband line driver (shown as line drivers 106'), forming a cascaded arrangement of line drivers. In such arrangements, the broadband radio frequency signal distribution connections of each broadband line driver 106 can have a common format with the broadband signal interface (e.g., providing optical or RF coaxial cable connectivity).

Each of the broadband line drivers 106 can be interconnected to a remote balun 108 via a twisted pair wire 110 interconnected to the twisted pair connection of that line driver, respectively. The remote baluns 108 shown in FIG. 1 generally convert differential twisted pair signals to grounded, radio frequency signals (e.g., as distributed via coaxial cabling). The remote balun 108 can be, in certain embodiments, a wall outlet-type balun or a freestanding balun, and can provide a broadband radio frequency connection for an endpoint device configured to receive broadband RF signals. An example of circuitry used in such a remote balun is discussed below in connection with FIG. 6.

In the embodiments of the present disclosure, the broadband radio frequency signals distributed within the facility 10 can take different forms. In example embodiments, the broadband radio frequency signals distributed by the system are adapted to be within the range of 5 to 862 MHz, representing typical bands of frequencies used to deliver cable television signals. In such embodiments, remote baluns 108 can be connected to any of a variety of types of endpoints capable of receiving and processing cable television signals, such as televisions, set top boxes, digital video recorders, or other electronic devices.

In accordance with the present disclosure, the broadband line drivers 106 include circuitry for managing output power on each of the twisted pair connections associated with that line driver by sensing attenuation between the line driver and an remote balun 108 to which the line driver is connected by twisted pair wiring 110. Additionally, the broadband line drivers 106 include circuitry for managing output power on each of the broadband radio frequency signal distribution connections, to provide for improved cascading of line drivers within a particular facility's twisted pair broadband radio frequency distribution system 100. Additional details regarding monitoring and management of twisted pair connections at a broadband line driver are provided below in conjunction with FIGS. 5 and 7.

Figure 2:
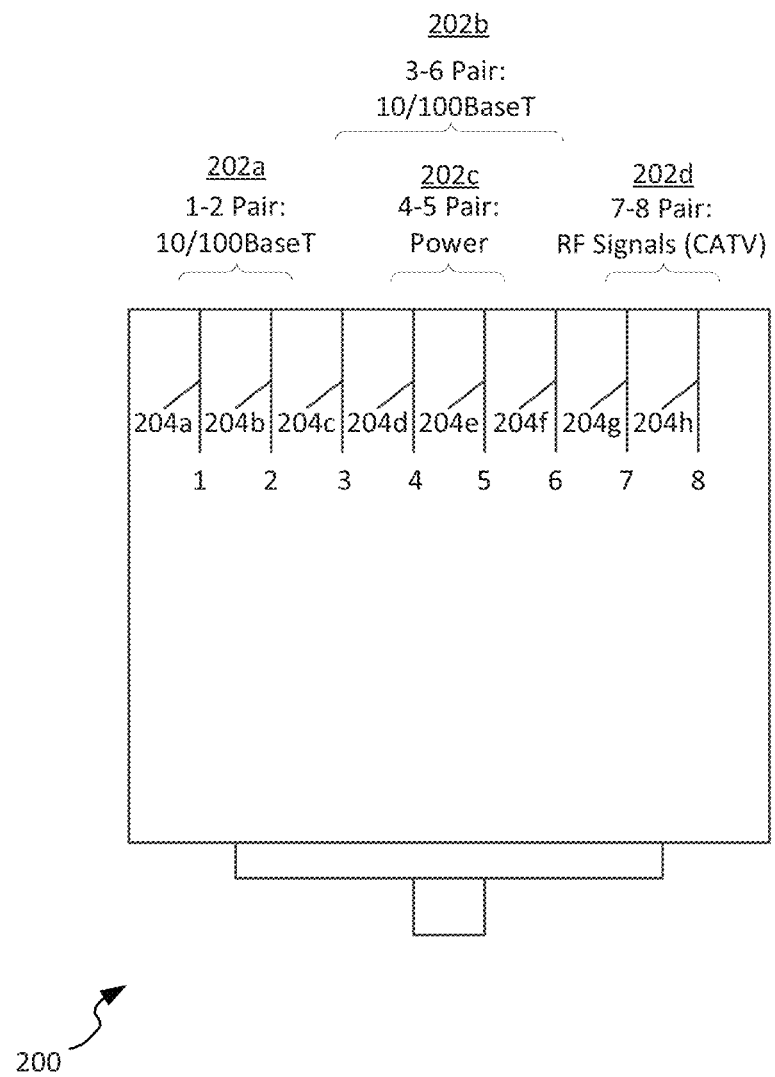
FIG. 2 is a schematic diagram illustrating wiring assignment in an RJ-45 connector, with which radio frequency signals can be transmitted within a facility using a twisted pair broadband radio frequency distribution system.

Referring now to FIG. 2, an example of a typical twisted pair jack 200 is illustrated. The twisted pair jack 200 can be used, for example, as a twisted pair connection at a broadband line driver 106 of FIG. 1, as well as to deliver data within a twisted pair network. In the embodiment shown, the twisted pair jack 200 is an RJ-45 jack; however, in alternative embodiments, other formats could be used as well.

In the embodiment shown, the twisted pair jack 200 includes a plurality of pairs 202 of twisted pair wires 204. In this embodiment, four pairs 202a-d are shown, with a first pair 202a formed from the first and second wires 204a-b, a second pair 202b formed from the third and sixth wires 204c, 204f, a third pair 202c formed from the fourth and fifth wires 204d-e, and a fourth pair 202d formed from the seventh and eighth wires 204g-h. The twisted pair jack 200 can be used to deliver broadband data, for example 10BaseT or 100BaseT signals, within a facility. In such embodiments, it may be the case that certain ones of the pairs 202a-d are unused. For example, in 10BaseT or 100BaseT systems, only the first and second pairs 202a-b are used. In such embodiments, and in accordance with certain features disclosed herein, another pair, such as the fourth pair 202d, could be used to transmit broadband radio frequency signals within the facility. Additionally, other unused pairs, such as the third pair 202c, could be used to deliver other types of services, such as power to a remote device, such as the remote baluns 108 discussed above.

Figure 3:
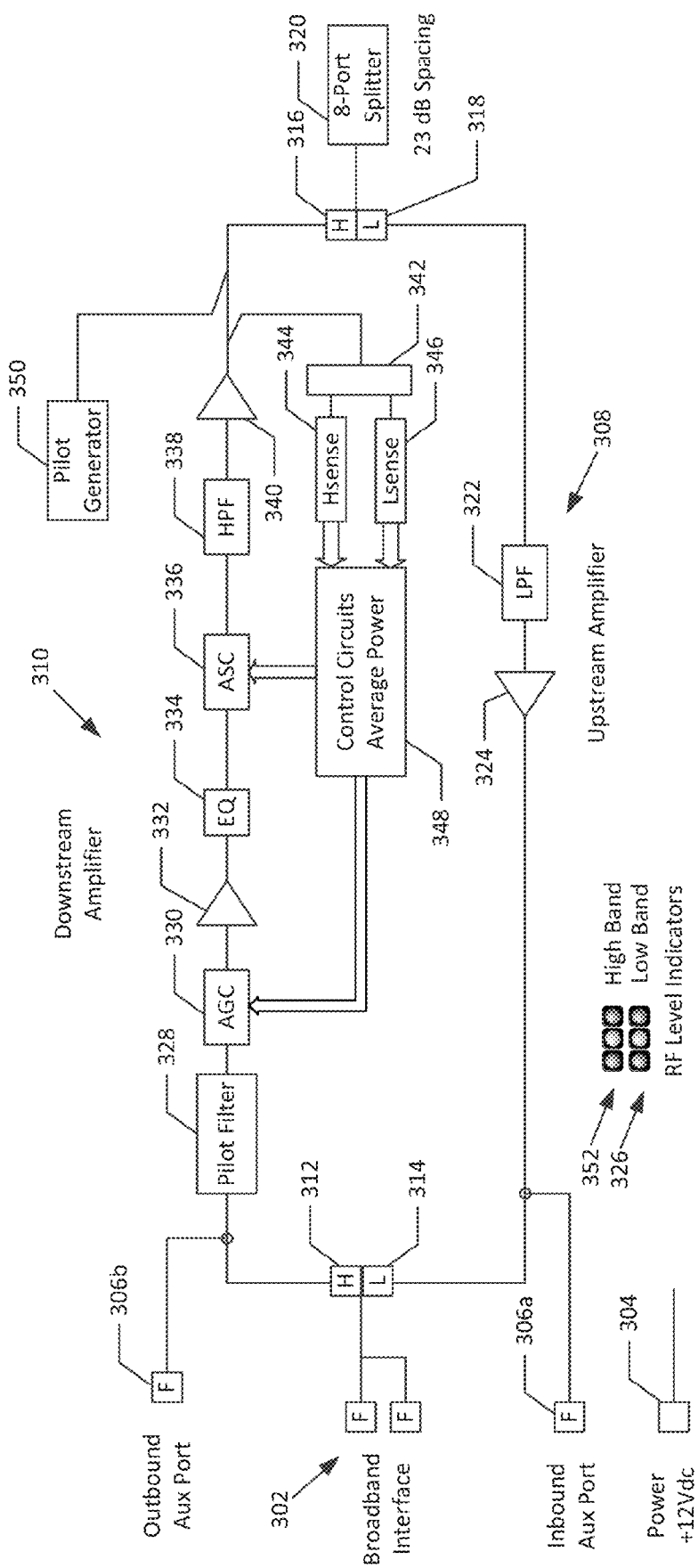
FIG. 3 is a schematic diagram illustrating signal processing within an example broadband radio frequency interface, according to a possible embodiment.

Referring now to FIG. 3, example circuitry 300 for a broadband distribution interface device 102 is shown. The circuitry 300 includes an upstream interface 302, illustrated as CATV interface. The upstream interface 302 receives broadband radio frequency signals, such as CATV signals, on a coaxial or optical network connection. The circuitry 300 also includes additional inputs, including a power input 304 (shown as a +12 volt power supply input), as well as inbound and outbound auxiliary ports 306a-b, configured to introduce or receive upstream or downstream signals locally at a facility, respectively.

The circuitry 300 defines an upstream path 308 and a downstream path 310. By upstream, it is intended that signals are traveling in a general direction toward a headend or broadband radio frequency signal distribution source, while downstream refers to a signaling direction from the headend to endpoints (e.g., televisions, set top boxes, or other electronics). It is understood that not all upstream signals will travel an entire length of a signal path from an endpoint to a headend, but may be received, filtered, and processed by a device along that route (such as broadband distribution interface device 102 or line driver 106). Similarly, downstream signals need not travel an entire signal path from a headend to an endpoint, but may be received and processed by a device between those components as well.

At the upstream interface 302, a frequency splitter, optionally formed from a high pass filter 312 and a low pass filter 314, separates signals onto the upstream path 308 and the downstream path 310, respectively. In the case of broadband cable television signals, the upstream path 308 will typically carry lower-frequency signals, while the downstream path 310 will carry higher-frequency signals. In one embodiment, the lower frequency signals are in the range of 5 to 42 MHz, and the higher frequency signals are in the range of 54 to 862 MHz. In an alternative embodiment, the lower frequency signals are in the range of 5 to 65 MHz, and the higher frequency signals are in the range of 85 to 862 MHz. Other frequency ranges could be used as well.

The upstream path 308 and downstream path 310 are merged at a set of high pass and low pass filters 316, 318, and the combined signals are transmitted to a splitter 320, which leads to broadband signal connections configured to distribute broadband radio frequency signals downstream (from the downstream path 310), and receive signals being passed upstream (destined for the upstream path 308). In the embodiment shown, the splitter 320 is an 8-port splitter providing 23 dB spacing between signals. Other splitter arrangements are possible as well.

On the upstream path, signals received from broadband signal connections and the splitter 320 are transmitted through a low pass filter 322 and upstream amplifier 324, and the resulting signal is returned to the upstream interface 302 via filter 312, as well as to inbound auxiliary port 306a.

A low band indicator 326 provides a visual indication of a power level of the received signal, prior to amplification, to indicate a quality of upstream data received at the broadband distribution interface device 102. In the embodiment shown, the low band indicator 326 includes colored light emitting diodes indicating whether a power level is acceptable (green LED), too high (yellow LED), or too low (red LED). Other indicator arrangements are possible as well.

On the downstream path 310, signals that are transmitted remain in a relatively wide frequency band, and attenuate at different rates downstream of the broadband distribution interface device 102. Accordingly, the circuitry 300 provides automatic monitoring, as well as gain and slope control of such signals to ensure that output power to downstream line drivers 106 is at an appropriate level for transmission ultimately to twisted pair networks. In the embodiment shown, the downstream path 310 includes a pilot filter 328 configured to remove any pilot signals received from upstream of the broadband distribution interface device 102. An automatic gain control circuit 330 determines an amount of amplification to apply across an entire frequency range passed along the downstream path 310, and an amplifier 332 amplifies the signals on the downstream path according to the gain control determined by the gain control circuit 330. An equalizer 334 connected to an output of the amplifier 332 reduces delay variations across the frequencies passed through the amplifier 332, as well as to flatten the gain applied to the signals on the downstream path 310. A slope control circuit 336 adjusts a slope of the signals, to ensure that the higher frequency signals, which experience greater attenuation over both coaxial and twisted pair wiring, are sufficiently amplified that downstream devices (e.g., broadband line drivers 106) receive relatively uniform signals across the desired frequency range. A high pass filter 338 removes any remaining low frequency signals that might have been generated within or received by the circuitry 300 of the downstream path 310, and a second amplifier 340 amplifies the slope-adjusted signal for transmission downstream through the high pass filter 316, as well as the splitter 320 and subsequent broadband signal connections.

To provide continuous adjustment of the gain and slope of signals on the downstream path 310, a feedback path following amplifier 340 is passed to a signal splitter 342, which in turn passes signals to a high frequency sensor 344 and a low frequency signal sensor 346. A control circuit 348 determines the average power of the high frequency signals and low frequency signals at the output of the amplifier 340, and can adjust the gain and slope of that signal by sending control signals to the gain control circuit 330 and the slope control circuit 336.

Through use of the control circuit 348, as well as the gain and slope control circuits 330, 336, automatic adjustment and amplification of received signals is provided within the broadband distribution interface device 102. The broadband distribution interface device 102 therefore need not require receipt of downstream signals having a sufficiently high power. In certain embodiments of the present disclosure, the broadband distribution interface device 102 is configured to be capable of receiving downstream RF signals having a power of anywhere between 0 dBmV to +25 dBmV, and can automatically adjust the output power of signals delivered to the splitter 320, and therefore to downstream devices.

In the embodiment shown, a pilot tone generator 350 is communicatively connected to the downstream path 310 following the amplifier 340, and injects a high-frequency tone onto the downstream line. The pilot tone can be used by downstream devices to monitor and control the gain and RF power at high frequencies, which typically experience the greatest amount of attenuation loss along cabling (e.g., coaxial, twisted pair, or optical). In certain embodiments, the pilot tone generator 350 is configured to generate a tone above a highest occupied frequency, such as an 869 MHz pilot signal. Other tone frequencies could be used as well.

In certain embodiments, a dedicated low frequency pilot tone could be used as well, to monitor gain and power of received signals at lower frequencies. However, in the embodiment shown, signal power in the lower end of the upstream band (e.g., 5-42 or 5-65 MHz) is used to monitor and control gain and power of low frequency signals.

Similar to the low band indicator 326, a high band indicator 352 provides a visual indication of a power level of the received downstream signal, prior to amplification, to indicate a quality of downstream data received at the broadband distribution interface device 102. In the embodiment shown, the high band indicator 552 includes colored light emitting diodes indicating whether a power level is acceptable (green LED), too high (yellow LED), or too low (red LED). Other indicator arrangements are possible as well.

Figure 5:
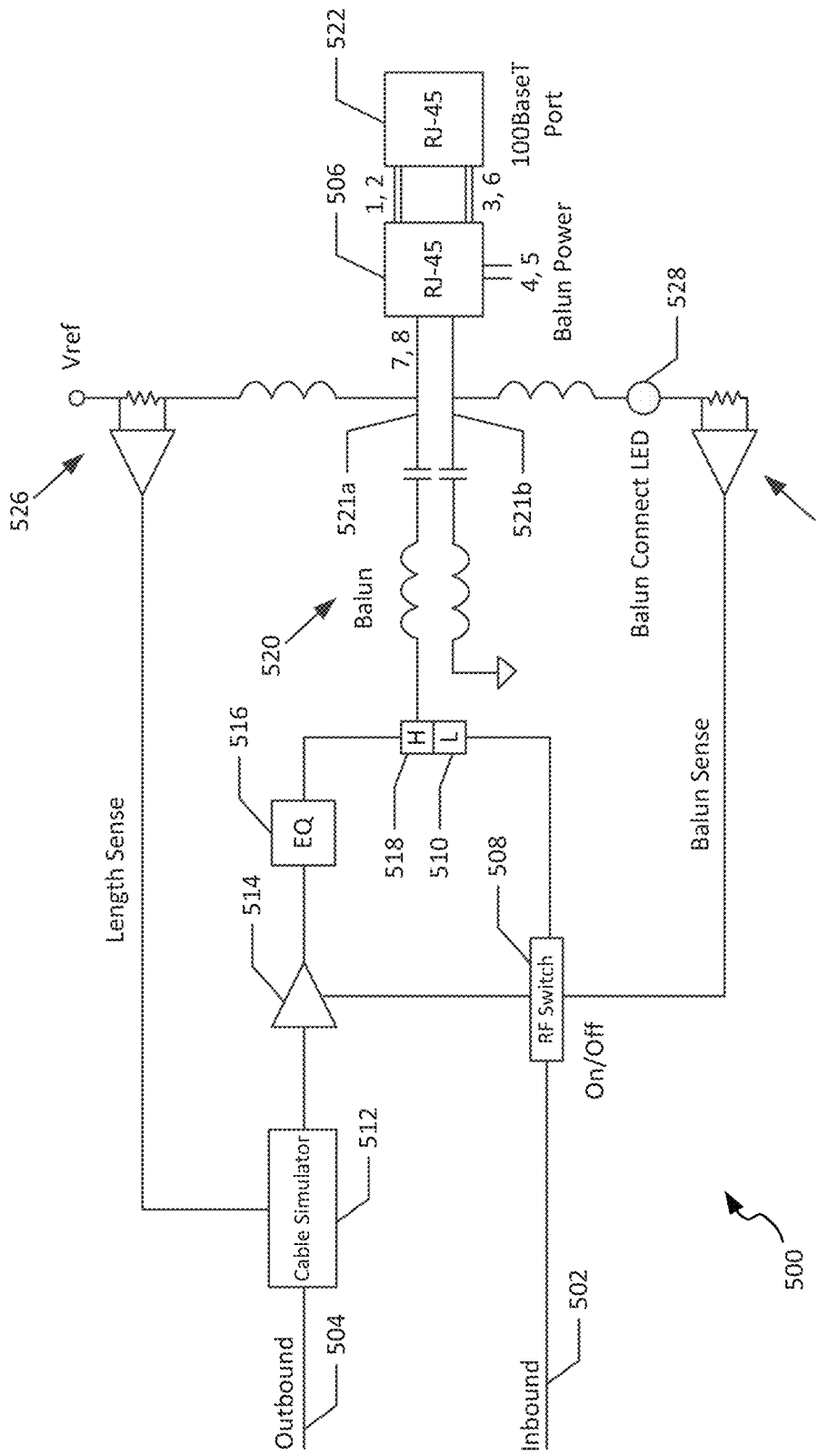
FIG. 5 is a schematic diagram illustrating signal routing and adjustment for broadband signal transfer to twisted pair wiring within a line driver used in the twisted pair broadband radio frequency distribution system of FIG. 1.

Referring now to FIGS. 4-5, circuitry 400 is illustrated that can be used in a broadband line driver, such as the line drivers 106 of FIG. 1, is shown. Referring specifically to FIG. 4, the circuitry 400 includes a repeater portion 402 and a twisted pair distribution portion 404. The circuitry 400 also includes a power connection 406, providing power to the circuitry 400 within the line driver 106.

The repeater portion 402 generally is configured to allow a broadband line driver to be connected upstream of another broadband line driver, forming a cascaded arrangement of broadband line drivers which will allow for distribution of signals across a larger physical area than would otherwise be limited by signal attenuation over a cable length. The repeater portion 402 generally includes a broadband signal interface connection 408, and is separated into an upstream path 410 and a downstream path 412.

The repeater portion 402 generally resembles the circuitry 300 of FIG. 3, but lacks the pilot tone generator 350 or pilot filter 328 described in that circuitry. Rather, a gain control circuit 414 is located at the broadband signal interface connection 408, and before signals are split by high pass and low pass filters 416, 418 onto the upstream and downstream paths 410, 412. The upstream and downstream paths 410, 412 are merged at a downstream end of the repeater portion at high and low pass filters 420, 422, and the combined signal is sent to a splitter 424, which distributes repeated and re-amplified broadband radio frequency signals at a plurality of distribution connections, for example to downstream broadband line drivers or other broadband radio frequency devices. In the embodiment shown, the splitter 424 is a 4-port splitter providing 23 dB spacing between signals. Other splitter arrangements are possible as well.

The upstream path 410 is analogous to that described in conjunction with FIG. 3, and includes a low pass filter 426, amplifier 428, and equalizer 430, the functionality of which is analogous to that previously described. The downstream path 412 includes an amplifier 432, equalizer 434, slope control circuit 436, high pass filter 438, and amplifier 440, again as described above. The upstream path 410 also includes a further equalizer 442 positioned immediately prior to high pass filter 416, to regulate the slope and gain of signals to be repeated onto a subsequent broadband line driver (as opposed to signals passed onto twisted pair wiring, as discussed below).

The repeater portion 402 also includes a signal splitter 444, high and low sense circuits 446, 448, and a control circuit 450, used to sense power of high frequency and low frequency signals and control gain and slope of amplified signals transmitted from the line driver. In certain embodiments, the high sense circuit 446 can use the pilot tone signal generated by the pilot tone generator of the broadband distribution interface device 102 to control a power level of high frequency signals.

The twisted pair distribution portion 404 includes a plurality of twisted pair connections used to distribute broadband radio frequency signals. In the embodiment shown, the twisted pair distribution portion 404 includes a plurality of connection boards 452, each of which has a plurality of twisted pair connectors thereon. In the embodiment shown, each of six connection boards 452 has four RJ-45 connection interfaces thereon, although in alternative embodiments other numbers or types of twisted pair connections could be used, with more or fewer connection boards.

Each connection board 452 has an inbound path 454 and outbound path 456 connected to that board, each associated with inbound and outbound signals, respectively. In the embodiment shown, the inbound paths are joined and passed through an amplifier 458, and merged onto the upstream path 410 of the repeater portion 402. This allows upstream signals from endpoints connected to the twisted pair connections to be routed back to a headend via the broadband line driver 106 and broadband distribution interface device 102. The outbound paths 456 are connected to the downstream path 412 of the repeater portion 402 via an amplifier 460 and equalizer 462. Additionally, a feedback path is provided from the output of the amplifier 460 to the splitter 444 and control circuitry 450, so the gain and slope generated by the line driver is adjusted based on observed output power to the twisted pair connections.

Furthermore, and as discussed above in connection with the circuitry 300, in certain embodiments the circuitry 400 includes indicators 464, 466, which respectively indicate the power level of signals observed on the upstream path 410 and downstream path 412.

Referring now to FIG. 5, example routing circuitry 500 for communicatively connecting outbound and inbound paths to a twisted pair connection is illustrated. The routing circuitry 500 can represent, for example, one of the four routing circuits used in each connection board 452 of FIG. 4. In the embodiment shown, the routing circuitry 500 provides a connection between inbound and outbound paths 502, 504, respectively, and a twisted pair connection 506, illustrated as an RJ-45 port. Other types of twisted pair connections could be used as well.

Generally, the routing circuitry 500 is configured to detect a length of twisted pair wiring used to deliver broadband radio frequency signals, and manage power levels associated with the broadband radio frequency signals sent and received via the twisted pair connection 506. In the embodiment shown, the inbound path 502 includes a radio frequency (RF) switch 508, and is connected to a low pass filter 510. The RF switch 508 selectively introduces a high or low attenuation onto the inbound line, for example in the case where the twisted pair line connected to the twisted pair connection 506 is relatively short, resulting in low attenuation.

The outbound path 504 includes a cable simulator 512, amplifier 514, and equalizer 516, which is in turn connected to a high pass filter 518. The cable simulator 512 is selectively activatable to introduce additional attenuation onto the outbound path 504, for example in the case where the twisted pair line connected to the twisted pair connection 506 is relatively short, resulting in low attenuation. The amplifier 514 can be activated or deactivated, for example to provide further amplification based on a detected remote balun (e.g., balun 108).

A local balun 520 positioned as an output of the merged high pass and low pass signals transforms those signals to a differential signal on a pair of twisted pair wires 521a-b (e.g., the 7-8 wires of an 8-wire twisted pair connection, such as an RJ-45 connection), and routes that signal to the twisted pair connector 506. The twisted pair connector 506 introduces a power signal onto a second pair of twisted pair wires (shown as the 4-5 wires, or third pair of wires in a RJ-45 jack). Additionally, a network connector 522 merges the twisted pair connector 506 with data connectivity using the two remaining pairs of a four-pair twisted pair connector, such as would be available in a 10/100BaseT connection.

On the pair of wires 521a-b, a balun sensing circuit 524 and a length sensing circuit 526 are included to determine (1) whether a far end balun is connected to the twisted pair connector 506, and (2) what the length of the twisted pair wiring is, based on a determination of attenuation from a predetermined voltage, respectively. The balun sensing circuit 524 provides a signal to the RF switch 508 and amplifier 514, and the length sensing circuit 526 provides a signal to the cable simulator. Based on a sensed voltage generated by the balun sensing circuit 524, one or both of the RF switch 508 and amplifier 514 may be activated or deactivated. The balun sensing circuit 524 includes a balun sensing identifier 528, which indicates visibly whether a remote balun is connected to the twisted pair wiring interconnected to the twisted pair connector 506 (for example by sensing signals on the 7-8 pair).

Furthermore, based on a sensed voltage generated by the length sensing circuit 526, the cable simulator 512 can be activated or deactivated, thereby selectively simulating additional length of twisted pair wiring by introducing attenuation onto the outbound path 504. Operational modes of the circuitry 500, in particular as controlled by the balun sensing circuit 524 and length sensing circuit 526, are discussed in further detail below in connection with FIG. 7.

Figure 6:
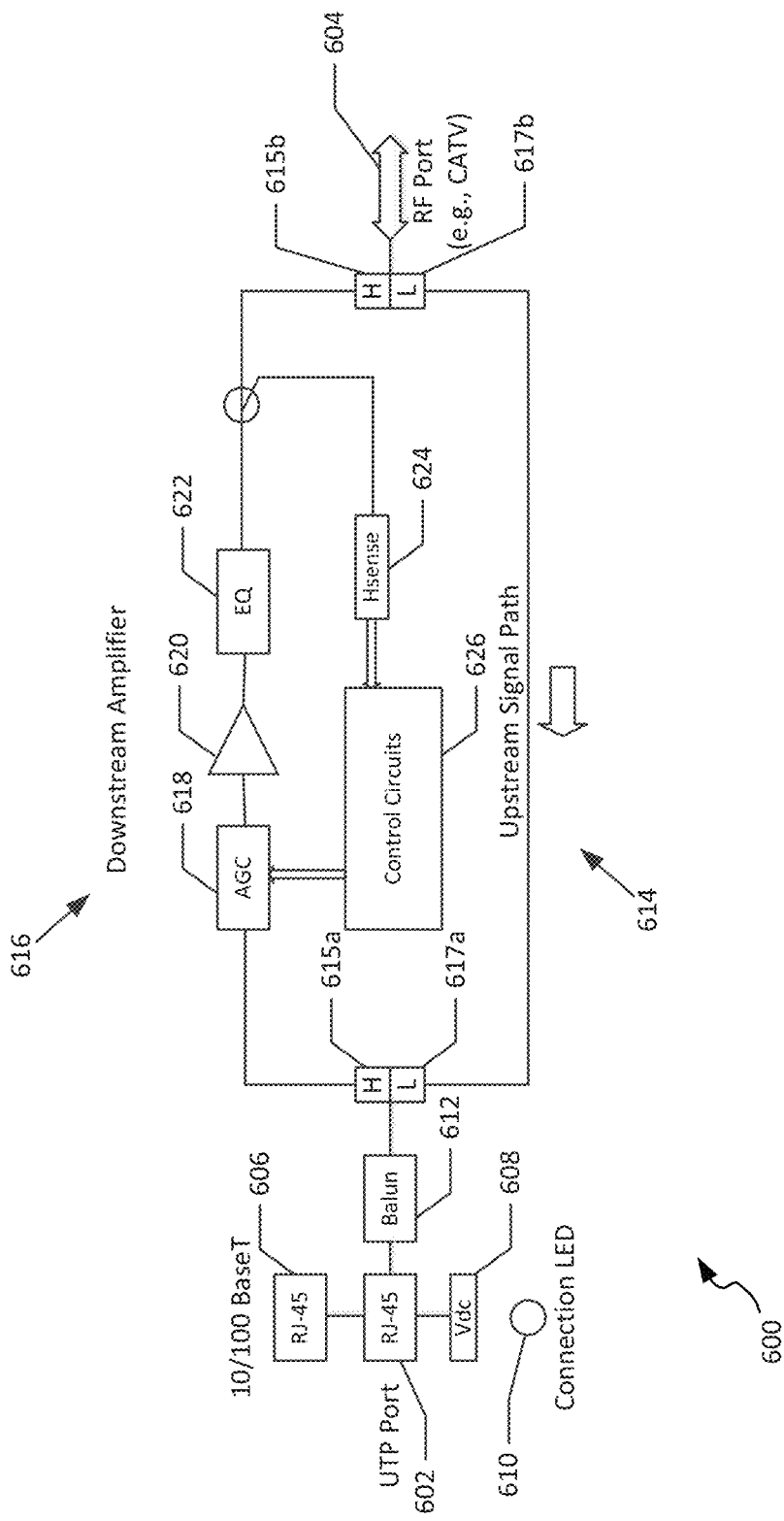
FIG. 6 is a schematic diagram illustrating signal processing within a remote active balun useable in the twisted pair broadband radio frequency distribution system of FIG. 1, which can be interfaced to radio frequency receiver within the facility.

FIG. 6 is a schematic diagram illustrating circuitry 600 that can be included within a remote active balun, such as balun 108 of FIG. 1. Typically the balun 108 including circuitry 600 is positioned at a location remote from the broadband line driver 106, and can be include either a wall outlet RF connector, or a freestanding balun element including an RF connector. In either case, the circuitry 600 is configured to provide broadband radio frequency signals for use by an endpoint, such as a television, set top box, or other electronic equipment. The circuitry 600 provides conversion between a twisted pair connector 602 (shown as an RJ-45 connector) and a coaxial connector 604 (shown as an F-type coaxial cable television signal connector). The circuitry includes a twisted pair data connector 606 configured to receive data signaling pairs of the twisted pair connector 602, such as the 1-2 and 3-6 pairs of a four-pair connector, as well as a voltage connection 608, which receives voltage from the 4-5 pair of the twisted pair connector 602. A connection indicator 610, shown as a light emitting diode, is activated when power is received on the 4-5 pair, indicating that a connection to a far end line driver or other device that provides power and broadband signals over twisted pair wiring has been established. In the embodiment shown, the 7-8 pair of signals received at the twisted pair connector 602 are routed to a balun 612, which converts the signals from differential signals on the twisted pair wiring to grounded, coaxial RF signals.

Between the balun 612 and the coaxial connector 604, the circuitry is separated into an upstream path 614 and a downstream path 616. In various embodiments, the upstream path 614 and downstream path 616 are separated according to frequency, with lower frequency signals used to transmit data on the upstream path 614 and higher frequency signals used to transmit data on the downstream path 616. Although the specific frequency ranges included on each of the upstream path 614 and downstream path 616 may vary, they will generally correspond to those same frequency ranges as implemented in the broadband line drivers 106 and broadband signal distribution interface device 102. A set of high pass filters and low pass filters 615a-b, 617-b, respectively, separate the higher and lower frequency signals onto the respective paths 614, 616.

In the embodiment shown, the downstream path 616 includes a gain control circuit 618, amplifier 620, and equalizer 622, used to adjust a gain, amplitude, and slope of a signal received at the balun. A high frequency sensor 624 captures a power level of a high frequency signal at an output of the equalizer 622, and a control circuit 626 adjusts the gain control circuit 618 to automatically adjust amplification of the downstream signal accordingly, before it is transmitted to an endpoint via the coaxial connector 604.

Figure 7:
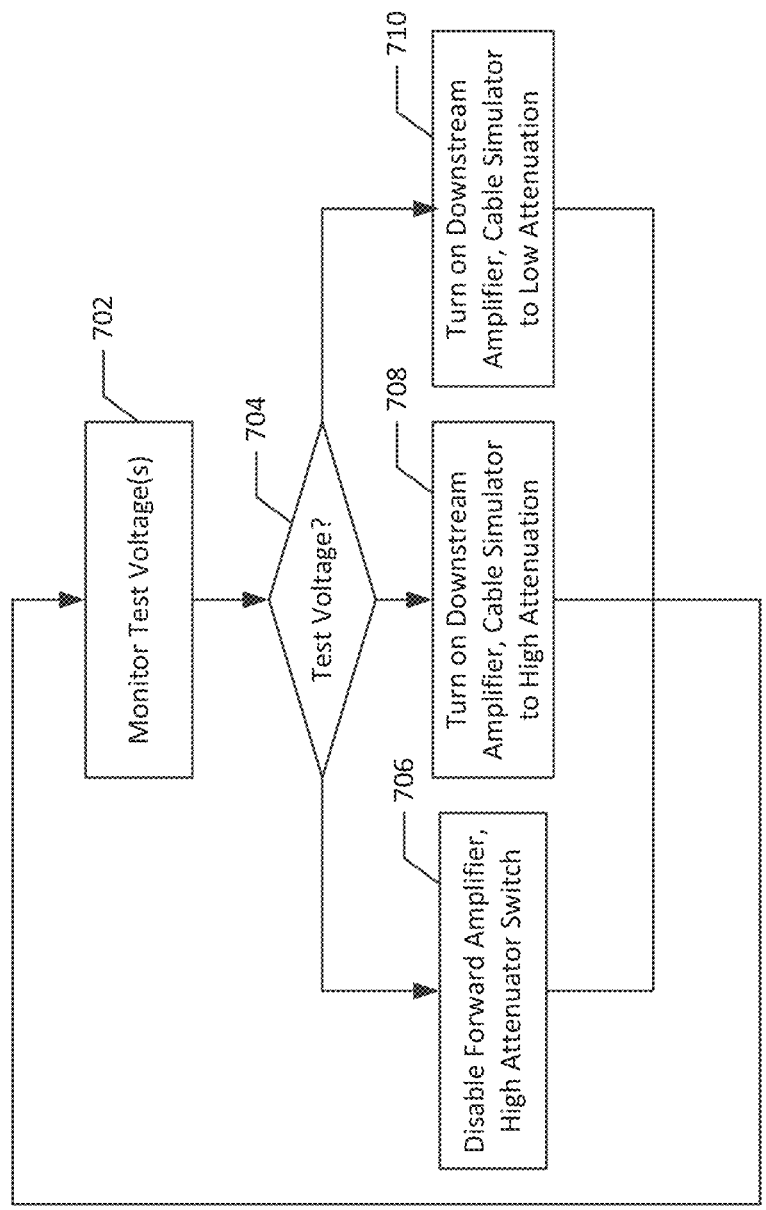
FIG. 7 illustrates a flowchart of operation of a line driver within a broadband radio frequency signal distribution system.

FIG. 7 illustrates a flowchart 700 of operation of a line driver within a broadband radio frequency signal distribution system, when connected to a remote balun. The flowchart 700 illustrates example adjustment of line driver circuitry, such as the routing circuitry 500 of FIG. 5, to ensure port-by-port customized power adjustment for broadband signals transmitted via twisted pair wiring. During operation, a remote balun has a direct current feedback component that allows a test voltage to be monitored at the line driver circuitry 500 (step 702). A voltage level is then assessed by one or both of the balun sensing circuit 524 and the length sensing circuit 526 (operation 704) If the monitored voltage is higher than a predetermined threshold level, this indicates that there is no connection between the balun and line driver. Accordingly, the circuitry 500 in the line driver, in particular the balun sensing circuit 524, will deactivate the downstream signal amplifier 514 and set the RF switch 508 to a high attenuation condition, essentially shutting off the return path and preventing ingress of unwanted RF signals on the 7-8 pair of a twisted pair cable (step 706).

If the monitored voltage is lower than a predetermined signal level, this indicates that a connection between the line driver 106 and remote balun 108 is relatively short, and that there is only limited attenuation occurring between those devices. Accordingly, the circuitry 500 in the line driver will activate the downstream amplifier 514, but activates the cable simulator 512, to attenuate the signal entering the amplifier 514 and prevent excess power from being delivered to that remote balun. Additionally, the return path RF switch 508 is set to a low attenuation condition, allowing upstream signals to be transmitted (step 708).

If the monitored voltage is above a second predetermined signal level, this indicates that a long cable is connected between the line driver 106 and the remote balun 108, as sensed by the length sensing circuit 526. In this situation, the cable simulator 512 is deactivated, the amplifier 514 is activated, and the RF switch 508 is set to a low attenuation condition (step 710).

After one or more actions are taken with respect to setting the signal amplifier 514, RF switch 508, or cable simulator 512, the line driver circuitry continues to monitor voltage, in case a connectivity state between the line driver and a remote balun changes over time (return to step 702).

Referring now to FIGS. 1-7 generally, it is noted that use of the twisted pair broadband radio frequency distribution system 100 disclosed herein allows for power consumption on a port-by-port basis, while allowing more than 65,000 radio frequency outlets to be supported (at remote baluns). Additionally, in certain aspects, the present disclosure provides a system that can be used concurrently with existing data communication networks, over shared twisted pair wiring, while preventing ingress of other data signals onto the network components intended to distribute broadband radio frequency signals. Other advantages are realized as well, and are apparent in the implementations discussed herein.

The above specification, examples and data provide a complete description of the manufacture and use of the composition of the invention. Since many embodiments of the invention can be made without departing from the spirit and scope of the invention, the invention resides in the claims hereinafter appended.

What is claimed is:
1. A broadband signal distribution interface device comprising:
(a) a broadband signal interface configured to receive broadband radio frequency signals;
(b) a plurality of broadband signal connections configured to distribute broadband radio frequency signals;
(c) circuitry defining an upstream signal path and a downstream signal path between the broadband signal interface and the plurality of broadband signal connections, the upstream signal path defining a low frequency range and the downstream signal path defining a high frequency range, the circuitry including a gain control circuit and a slope control circuit each positioned along the downstream signal path, wherein the circuitry is configured to accommodate downstream transmission of the broadband signals onto twisted pair wiring.

2. The broadband signal distribution interface device of claim 1, wherein the broadband signal interface is a coaxial cable interface.

3. The broadband signal distribution interface device of claim 1, wherein the broadband signal interface is an optical cable interface.

4. The broadband signal distribution interface device of claim 1, further comprising a control circuit configured to sense an output power level of broadband radio frequency signals.

5. The broadband signal distribution interface device of claim 4, further comprising a pilot signal generator providing a pilot signal on the downstream path, the pilot signal having a predetermined signal strength and useable by downstream devices to estimate a cable length between the broadband signal distribution interface device and the downstream device based on a level of attenuation of the pilot signal as compared to the predetermined signal strength.

6. The broadband signal distribution interface device of claim 1, further comprising an automatic indicator placed on at least one of the upstream signal path and the downstream signal path and configured to display an indication of signal strength of broadband radio frequency signals received at the broadband signal distribution interface device.

7. The broadband signal distribution interface device of claim 6, wherein the automatic indicator includes one or more light emitting diodes indicating an attenuation level of signals received at broadband signal input interface and at least one of the broadband signal connections.

8. A broadband line driver comprising:
(a) a broadband signal interface configured to send and receive broadband radio frequency signals;
(b) a plurality of twisted pair connections, each of the twisted pair connections configured to distribute broadband radio frequency signals;
(c) circuitry defining an upstream signal path and a downstream signal path communicatively connected to the broadband signal input interface, the upstream signal path defining a low frequency range and the downstream signal path defining a high frequency range;
(d) a twisted pair interface circuit having an outbound signal path connecting one of the plurality of twisted pair connections to the downstream signal path and an inbound signal path connecting the one of the plurality of twisted pair connections to the upstream signal path, the twisted pair interface circuit including:
an amplifier positioned on the outbound signal path;
a radio frequency switch positioned on the inbound signal path; and
a voltage monitoring circuit configured to activate one or both of the amplifier and the radio frequency switch depending upon an observed voltage.

9. The broadband line driver of claim 8, further comprising a cable simulator circuit positioned on the outbound signal path, the cable simulator circuit configured to selectively introduce signal attenuation on the outbound signal path.

10. The broadband line driver of claim 8, wherein each of the plurality of twisted pair output connections has first, second, third, fourth, fifth, sixth, seventh, and eighth wire connections, and wherein the broadband radio frequency signals are distributed on the seventh and eighth wire connections.

11. The broadband line driver of claim 8, further comprising an interface circuit associated with each of the plurality of twisted pair output connections.

12. The broadband line driver of claim 8, further comprising a plurality of broadband radio frequency signal distribution connections.

13. The broadband line driver of claim 12, wherein the broadband signal interface has a format compatible with a format of the broadband radio frequency signal distribution connections.

14. The broadband line driver of claim 8, wherein the circuitry includes a gain control circuit.

15. The broadband line driver of claim 14, wherein the circuitry further includes a control circuit configured to automatically control the gain control circuit based on a pilot signal.

16. The broadband line driver of claim 14, wherein the circuitry further includes a slope control circuit positioned along the downstream signal path.

17. The broadband line driver of claim 16, wherein the circuitry further includes a control circuit configured to automatically control the slope control circuit based on a power level of a signal provided to a twisted pair interface circuit.

18. The broadband line driver of claim 16, wherein the signal provided to a twisted pair interface circuit and used by the control circuit has a frequency at a low end of a range of broadband radio frequency signals transmitted on the downstream path.

19. The broadband line driver of claim 8, wherein the twisted pair interface circuit includes a telecommunications jack interface.

20. The broadband line driver of claim 19, wherein the telecommunications jack interface includes an RJ-45 jack.

21. A method of adjusting output power of broadband radio frequency signals on twisted pair lines, the method comprising:
    monitoring a reference voltage level received at a broadband line driver via a twisted pair connection;
    upon determining that the reference voltage level exceeds a predetermined level, deactivating an amplifier connected to a downstream path leading to the twisted pair connection and setting a radio frequency switch connected along an upstream path to a high attenuation condition;
    upon determining that the reference voltage is below a second predetermined level, activating the amplifier and setting the radio frequency switch to a high attenuation condition; and
    upon determining that the reference voltage exceeds a third predetermined level, activating the amplifier and setting the radio frequency switch to a low attenuation condition.

22. The method of claim 21, wherein the broadband line driver has a plurality of twisted pair connections.

23. The method of claim 22, further comprising:
    for each of the plurality of twisted pair connections:
        monitoring a reference voltage level received at a broadband line driver on twisted pair lines associated with the respective twisted pair connection;
        upon determining that the reference voltage level exceeds a predetermined level, deactivating an amplifier connected to a downstream path leading to the twisted pair connection and setting a radio frequency switch connected along an upstream path to a high attenuation condition;
        upon determining that the reference voltage is below a second predetermined level, activating the amplifier and setting the radio frequency switch to a high attenuation condition; and
        upon determining that the reference voltage exceeds a third predetermined level, activating the amplifier and setting the radio frequency switch to a low attenuation condition.

24. A broadband signal distribution system useable at a facility, the system comprising:
    a broadband signal distribution interface device configured to receive broadband radio frequency signals from a headend and including a plurality of broadband signal connections, the broadband signal distribution interface device including circuitry defining an upstream signal path and a downstream signal path, the circuitry including a gain control circuit and a slope control circuit each positioned along the downstream signal path, wherein the circuitry is configured to accommodate downstream transmission of the broadband signals onto twisted pair wiring;
    a plurality of broadband line drivers communicatively coupled to the broadband signal connections of the broadband signal distribution interface device, each of the plurality of broadband line drivers including a plurality of twisted pair interfaces, each twisted pair interface associated with a twisted pair interface circuit having an outbound signal path and an inbound signal path, the twisted pair interface circuit including an amplifier positioned on the outbound signal path and a radio frequency switch positioned on the inbound signal path, and a voltage monitoring circuit configured to activate one or both of the amplifier and the radio frequency switch depending upon an observed voltage or a signal received from an active balun device configured to receive broadband signals over twisted pair wiring for connection to a broadband endpoint.

25. The system of claim 24, further comprising a second broadband line driver communicatively connected to one of the plurality of broadband line drivers, thereby forming a cascaded arrangement of broadband line drivers.

26. The system of claim 24, wherein the broadband radio frequency signals include cable television signals.

* * * * *